United States Patent [19]

Campbell

[11] Patent Number: 4,493,080
[45] Date of Patent: Jan. 8, 1985

[54] ERROR CORRECTING CODE DECODER

[75] Inventor: Russell J. Campbell, Kanata, Canada

[73] Assignee: Her Majesty the Queen in right of Canada, as represented by the Minister of National Defence, Ottawa, Canada

[21] Appl. No.: 422,465

[22] Filed: Sep. 23, 1982

Related U.S. Application Data

[63] Continuation-in-part of Ser. No. 323,809, Nov. 23, 1981, abandoned.

[30] Foreign Application Priority Data

Dec. 8, 1980 [CA] Canada ................................. 366304

[51] Int. Cl.³ ............................................. G06F 11/10
[52] U.S. Cl. ..................................... 371/37; 364/724; 375/116
[58] Field of Search .................... 371/37, 43; 364/724, 364/728; 375/116

[56] References Cited

U.S. PATENT DOCUMENTS

| 3,432,754 | 3/1969 | Schwartz | 364/724 |
| 3,883,729 | 5/1975 | de Cremiers | 375/116 |
| 4,169,286 | 9/1979 | Uzonoglu et al. | 375/116 |
| 4,203,002 | 5/1980 | Nossen | 375/116 |
| 4,234,930 | 11/1980 | Campbell | 364/724 |
| 4,240,156 | 12/1980 | Doland | 371/37 |
| 4,290,139 | 9/1981 | Walsh | 375/116 |
| 4,414,676 | 11/1983 | Kraul et al. | 375/116 |

OTHER PUBLICATIONS

Hsiao et al., Data Coding Techniques Using Low-Correlation Sequences, IBM Tech. Discl. Bulletin, vol. 13, No. 11, Apr. 1971, pp. 3544-3546.
Stein et al., Digital Matched Filters, Electronic Engineering, vol. 40, No. 484, Jun. 1968, pp. 341-342.

*Primary Examiner*—Charles E. Atkinson
*Attorney, Agent, or Firm*—Edward E. Pascal

[57] ABSTRACT

A method and apparatus which can significantly reduce the matched filter requirements in decoding cyclic block codes, and is particularly advantageous for decoding maximal length block codes, and other cyclic block codes in which the number of codewords is $\leq 2^k$ where $k$ is the number of data bits encoded into each codeword. The signal containing the codeword is concatenated with itself, then the concatenated signal is applied to a matched filter to provide a peaking signal at some point in time as the concatenated signal is passed through the matched filter. The position of the peaking signal relative to a predetermined instant of time is sensed whereby the identity of the codeword (and thus data) can be determined.

36 Claims, 11 Drawing Figures

ERROR CORRECTING CODE DECODER

This application is a continuation-in-part of application Ser. No. 323,809, filed Nov. 23, 1981, now abandoned.

This invention is a decoder apparatus and method which is particularly useful for decoding cyclic block codes which may include a number of errors per codeword, the number of errors depending on the codes selected.

Block error correcting codes encode k data bits into n bit codewords, where n is larger than k, according to a predetermined coding algorithm. The signals carrying the codewords are typicaly transmitted to a receiver where each codeword is decoded into the k data bits. The decoding process becomes more difficult and expensive as n increases and therefore codes which theoretically give the best error correcting performance are often rejected in favour of codes which are easier to decode. The present invention substantially simplifies the decoding problem for certain types of block codes thus enabling codes to be selected on the basis of their theoretical error correcting performance.

Present error correction schemes process the encoded bit stream as it emerges from a modem associated with a receiver. This bit stream contains errors and as the signal-to-noise ratio of the received signal decreases, the number of errors in the bit stream from the modem increases. Prior art error correcting schemes which process this bit stream have been found to fail catastrophically when the error rate becomes modestly high.

Two methods of decoding block codes are currently employed: matched filter decoding using as many matched filters as codewords, and algebraic decoding.

Matched filter decoding requires a separate matched filter for each codeword. For a (16,4) block code, each possible combination of 4 data bits is encoded into one of 16 possible codewords of 16 bits each. Thus 16 matched filters are required, either as 16 hardware matched filters or 16 software matched filters. As n increases, the practicality of hardware matched filters decreases due to the requirement for high numbers of components, and the practicality of n software matched filters decreases due to the requirement for excessive processing time.

Algebraic decoding utilizes special properties of the codes (and frequently codes are chosen because they have these properties), and a clever algorithm to accomplish the decoding. However, frequently, inferior codes are chosen simply because the better codes cannot be decoded in real-time or unacceptably low data rates would have to be employed.

The present invention is a method and apparatus which can significantly reduce the matched filter requirements in decoding cyclic block codes, and is particularly advantageous for decoding maximal-length-sequence block codes, and in general for cyclic block codes in which the number of codewords is $\leq 2^k$ where $k$ is the number of data bits encoded into each codeword. The invention is based on the recognition that a codeword from a cyclic code concatenated with itself contains every other codeword of the set of codewords somewhere within the concatenated codeword. Accordingly, a matched filter matched to any codeword, (except the all zeroes codeword case, if present in the codeword set) will indicate the presence of the desired codeword once as the double length codeword is passed through it. Thus each codeword can be detected by the position of the autocorrelation peak as the double length codeword is shifted through the matched filter. The output of the matched filter is the familiar cyclic autocorrelation function of $-1,-1,-1\ldots n,-1,-1\ldots$ for m sequence codes with the peak,n, occurring at a position depending on the received codeword and matched filter. For deBruijn sequence codes as well, the matched filter output is the cyclic autocorrelation function with the peak position dependent on received codeword and matched filter. Therefore one matched filter appears to be sufficient for the detection of all such codewords. This of course may not always be possible since each codeword must pass through the matched filter twice, and during the second pass, a new codeword is being received from the source. Thus two matched filters are required unless the correlation process can be carried out in one codeword bit duration.

In general, the invention is means for concatenating a cyclic block code coded input signal with itself, a filter matched to a first predetermined code sequence of the signal connected to receive the concatenated signal, and a peak position decoder connected to receive an output signal from the matched filter for providing an indication of the position of an autocorrelation peak corresponding to the code sequence relative to the input signal code, whereby the particular codeword is designated and information bits are decoded.

In the description herein it should be recognized that the word "codeword" means a signal which contains a codeword, the signal being either in analog or digital form.

A better understanding of the invention will be obtained by reference to the detailed description below, in conjunction with the following drawings, in which:

FIGS. 6 and 6A are block diagrams of another embodiment of the invention, and

Figure 1:
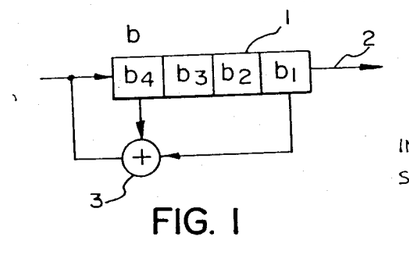
FIG. 1 is a block diagram of a prior art system for generating cyclic block codes.

FIG. 1 shows a maximal length cyclic code generator. A shift register 1 contains four stages, $b_1$, $b_2$, $b_3$ and $b_4$. The shift register is adapted to shift a signal through its various stages from $b_4$ to $b_1$, from which the output signal is taken on lead 2. The output of stages $b_1$ and $b_4$ are applied to the inputs of a modulo 2 adder 3, the output of which is applied to the input of stage $b_4$.

| Information Bits | Codeword |
|---|---|
| 0000 | 000000000000000 |
| 0001 | 000111101011001 |
| 1000 | 100011110101100 |
| 0100 | 010001111010110 |

-continued

| Information Bits | Codeword |
| --- | --- |
| 0010 | 001000111101011 |
| 1001 | 100100011110101 |
| 1101 | 110010001111010 |
| 0110 | 011001000111101 |
| 1011 | 101100100011110 |
| 0101 | 010110010001111 |
| 1010 | 101011001000111 |
| 1101 | 110101100100011 |
| 1110 | 111010110011001 |
| 1111 | 111101011001000 |
| 0111 | 011110101100100 |
| 0011 | 001111010110010 |

Prior art correlation detection of these codewords previously required 16 matched filters, each matched to a different codeword. Ignoring for a moment the all zeros codeword case, it will be noted that each codeword is a cyclic shift of any other. In the present invention, any received codeword is concatenated with itself and produces a new codeword twice as long; and every such codeword will contain every other single codeword of the set of codewords in the code somewhere inside it.

As the double length codeword is passed through a matched filter, the received codeword is detected by locating the position of the autocorrelation peak as the double length codeword is shifted through the matched filter. A different received codeword will cause the autocorrelation peak to occur at a different position.

Figure 2:
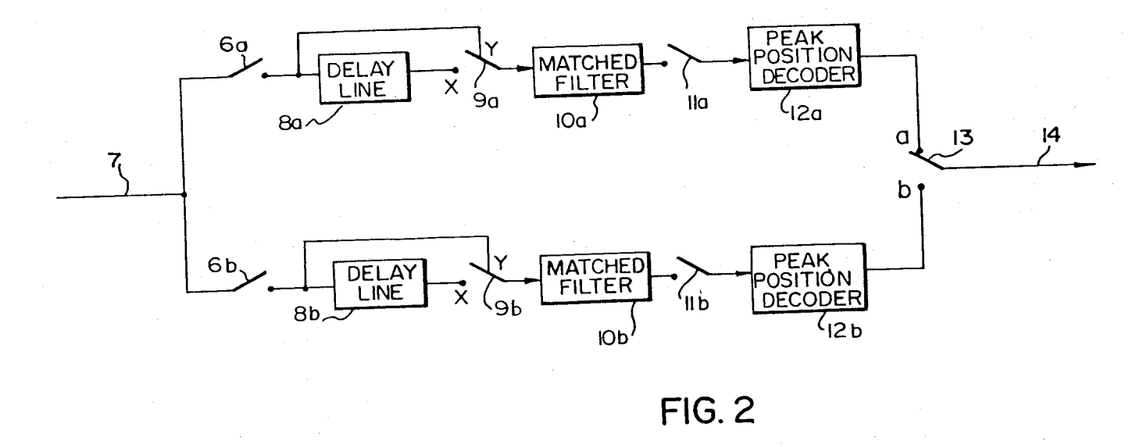
FIG. 2 is a block diagram of the present invention.

FIG. 2 is a block diagram of the invention, used for the non all zeros codeword case.

At the beginning of a codeword, switch 6a is caused to close by means of a synchronization signal generated elsewhere and not part of this invention (but which is utilized by all decoding circuits regardless of type). At the end of the codeword, switch 6a opens and switch 6b closes.

The input signal which carries a sequence of codewords is applied to input lead 7, which applies it to the input terminals of switches 6a and 6b. The output terminals of switches 6a and 6b are connected to the inputs of delay lines 8a and 8b respectively. The output of delay line 8a is connected to one of the terminals X of transfer switch 9a, which has its transfer contact connected to the input of a matched filter 10a. The input of delay line 8a is connected to the second terminal Y of transfer switch 9a.

Similarly, in a second arm of the circuit, the output of delay line 8b is connected to terminal X of transfer switch 9b, which has its transfer contact connected to the input of matched filter 10b. The input of delay line 8b is connected to the other terminal Y of switch 9b. The outputs of matched filters 10a and 10b are individually connected through corresponding switches 11a and 11b to the inputs of corresponding peak position decoders 12a and 12b. The outputs of peak position decoders 12a and 12b are connected to the terminals a and b of transfer switch 13, the transfer contact being connected to output lead 14.

At the start of a codeword switch 6a is closed, and at the end of the codeword switch 6a opens while switch 6b closes. Consequently the two parallel arms of the circuit process alternate codewords. If the processing can be carried out in one bit duration, then only one arm is required (e.g. for the digital case in which the clock is one code bit long).

When switch 6a closes, switch 9a closes to position Y, and when switch 6a opens, switch 9a closes to position X. Thus when switch 9a is in position Y, with switch 6a closed, the codeword enters both matched filter 10a and delay line 8a. When switch 6a opens, and switch 9a closes to position X, the codeword is caused to enter matched filter 10a a second time.

Switch 11a opens when switch 6a closes and vice versa thus preventing the first n outputs of the matched filter from entering the peak position decoder. Switch 13 switches to position a when switch 6a closes.

Of course it will be realized that since only one peak position encoder passes signal to output lead 14 at a time, only a single peak position decoder need be used having its input switched to matched filters 10a and 10b alternately, and having its output directly connected to output lead 14.

It will be noted that two cycles of the codeword pass through matched filter 10a. As soon as a match to the codeword has been detected, matched filter 10a generates the highest level output (in the absence of noise and errors in the received codeword). This is applied to peak position decoder 12a, which provides an output correlating with the position of this high level output from matched filter 10a, from some reference time. The position of the peak can be used by external circuitry to indicate which of the codewords has been detected and consequently provide the data transmitted.

The second arm of the circuit of FIG. 2 comprising delay line 8b, matched filter 10b and peak position decoder 12b operates in an identical fashion to that described above, but for the codeword which immediately follows the one processed by the other circuit arm described above.

Only one arm is required if the matched filter and peak position processing can be carried out before the next chip is clocked in from the incoming signal, i.e. time is speeded up by a factor of 2n where n is the number of chips in a codeword. The codeword is clocked into the delay line and matched filter at rate R Hz. Before the next rising edge of this clock, a clock at rate at least 2nR shifts the codeword out of the delay line into the matched filter and the output of the matched filter is fed into the peak position detector at the same rate.

If the codeword is clocked into the matched filter (i.e. through switch 6a) at a rate of R Hz, the data bits out of switch 13 are in general at a rate (K/n)R.

For the analog case, the entire process of shifting the codeword through the filter and detection of the peak must be done within one cycle of the clock which shifts the received codeword into the matched filter.

The all zeros codeword case can be avoided by avoiding the all zeros data case, by providing a matched filter for the all zeros codeword, or by providing circuitry which will detect that the output is constant, since the correlation for an all zeros codeword would not change as the double length, all 0's codeword shifts through. Since the number 1's and 0's in each codeword would normally differ by 1, then the output of the matched filter would be $+1$ or $-1$ for the error free case.

An example of the correlation position for a number of codewords is shown in appendix A.

One of the advantages of the present invention will become evident by reference to the following example. Consider an (n,k) cyclic code. K data bits are transforming into an n bit codeword. There are at least $2^k - 1$ non-zero codewords which would normally require $2^k-1$ matched filters for optimum detection. It is a property of cyclic codes that any codeword can generate other codewords by a cyclic shift of itself. Thus one codeword can generate (n−1) other codewords. All non-zero codewords can be generated by choosing appropriate code "seed" codewords and cyclically shifting each one. Thus the number of matched filters required to detect all codewords is reduced by a factor of n which can be significant.

The creation of the double codeword has a second advantage which may not be immediately obvious. Consider the periodic autocorrelation function for a maximal length sequence (m sequence). It is −1 everywhere except for the instant of correlation where it is equal to n, the length of the sequence. This often quoted autocorrelation function is valid only for the special case in which the sequence is repeatedly passed through the matched filter. Normally this autocorrelation arises in special cases such as ranging and not in the more general signalling case. If an m sequence is preceded by anything other than itself, the partial correlation terms (often referred to as sidelobes) are not −1 and are different for each preceding bit sequence. At the instant of correlation, the autocorrelation peak is still n however. Such an instance arises each time a new double length codeword starts to enter the matched filter since the matched filter still contains half of the old double length codeword. It takes n shifts to purge the matched filter of the old codeword and load it with a new one. After this is done (i.e., after the first half of the double length codeword is shifted into the matched filter), the familar autocorrelation function consisting of all −1's until the instant of correlation will appear at the output of the matched filter. Thus in the error-free case, the autocorrelation peak can easily be detected since all sidelobes will be −1.

In the case of received codeword bit errors, the sidelobes will rise from −1 to a value which depends both on their number and position. In the worst case in which each bit error adds to the same sidelobe, the sidelobe to autocorrelation peak relationship is as indicated below.

| Number of Errors | Worst Case Sidelobe | Autocorrelation Peak |
| --- | --- | --- |
| 0 | −1 | 15 |
| 1 | 1 | 13 |
| 2 | 3 | 11 |
| 3 | 5 | 9 |
| 4 | 7 | 7 |

It is readily seen that simple peak detection can determine the position of the autocorrelation peak (and thus the data sent) for 3 or fewer errors just as the more complicated algebraic decoding algorithms do. As the length of the code increases, the advantage of the proposed technique increases.

The present invention can be applied where the matched filters and delay lines are software types, or are of analog type. In the latter case, each of the delay lines can be, e.g., a SAW (surface acoustic wave) device at appropriate frequencies and bit rates, or charge coupled devices at lower frequencies and bit rates. The delay lines thus can be analog delay lines and the matched filters, analog matched filters, or, in the digital case, the delay lines can be n bit shift registers and the matched filters, digital matched filters. The delay lines (or shift registers) should be 1 codeword in length, and the matched filters should be also matched to 1 codeword.

In the analog case, the capability is provided of having an error correcting coding scheme degrade gracefully in fades, for example. Digital error correcting systems fail abruptly when signal levels fall and error rates increase beyond certain values. The analog matched filtering method, previously not practical due to the large number of matched filters required, allows the error correcting coding to be used as negative values of Eb/No (in decibels).

The ability to use error correcting codes at negative signal-to-noise ratios has a further advantage which will become evident in a following example. Consider a direct sequence spread spectrum system with a 100 to 1 spreading ratio, i.e., 100 bits (commonly called chips) are transmitted for each data bit at a rate of 100 times that of the date rate thus spreading the spectrum of signal beyond that required to transmit the data. The value of Ec/No (energy-per-chip-to-noise-density ratio) may be required to be negative for some spread spectrum applications and conventional modulation techniques cannot be used. A correlative demodulation technique is used to de-spread the signal and restore the data sequence. This process can be thought of as error correction coding with a (100,1) block code. However no error correction occurs since the information associated with each data bit is not dispersed among any other data bits as it is in a true error correction scheme. However, if a (1023,10) error correcting code is used, a spreading ratio of 100 to 1 can be maintained and the information per data bit is spread over 10 data bits. Such a (1023,10) code performs two functions: spectrum spreading and error correction and the matched filter detection scheme described herein allows a low rate (i.e. high spreading ratio) code to be used for both spectrum spreading and error correction. Previously, spectrum spreading (and despreading) was carried out separately from error correcting coding and decoding.

While the detection of the position of an autocorrelation peak corresponding to a concatenated cyclic block coded input signal relative to a representation of the code is described above, it should be noted that the signal itself can be a sequence of length n (where there is no restriction on the value of n other than that it is a positive integer), the sequence being cyclically shifted n times, whereby the transmission of n different pieces of information can be facilitated. Each piece of information corresponds to an unique cyclic shift of the sequence. Detection of the position of the autocorrelation peak provides decoding of the particular cyclic shift of the sequence, and thus the information corresponding to the shift. A sufficient autocorrelation function is one for which the autocorrelation peak is n and all other values are zero or much smaller than n. A cyclic autocorrelation function for m-sequences is considered sufficient or good since it has an autocorrelation peak of n and is −1 everywhere else. A cyclic autocorrelation function with an autocorrelation peak of n and any other values close to n is not considered to be sufficient.

Consequently the present invention is a decoder comprising apparatus for providing a correlation signal representing a cyclic correlation of an input signal with a signal representing a predetermined code word, determining the position of an autocorrelation peak, and indicating the presence of the predetermined code word upon the peak being in a predetermined position.

Figure 2A:
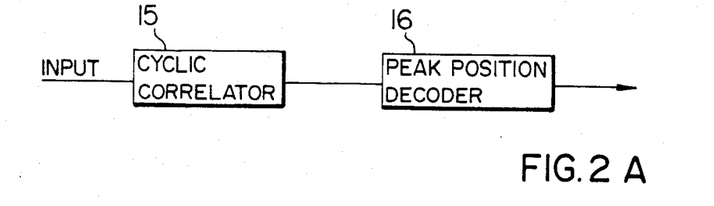
FIG. 2A is a block diagram of the invention in its general aspect.
Figure 2B:
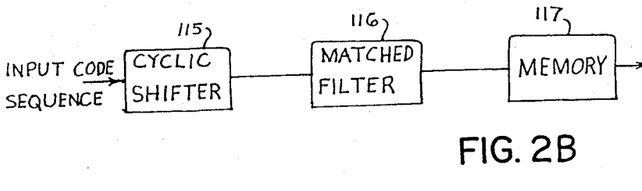
FIG. 2B is a block diagram of apparatus for providing a correlation signal.

The correlation signal can be provided as shown in FIG. 2B by cyclically shifting n times an input signal code sequence having length n bits containing the code in a cyclical shifter 115, n being a positive integer, and applying the shifted input signal to a matched filter 116, matched to the predetermined code word, whereby the signal representing a cyclic correlation of the input signal is provided at the output of the filter.

The indicating apparatus can be comprised of a memory 117 containing at least one data code, whereby the data code address in the memory is addressed upon the autocorrelation peak being in a predetermined position for indicating the address of the stored data code.

FIG. 2A illustrates the general concept of the invention apparatus 15 for providing a correlation signal representing a cyclic correlation of an input signal with a signal representing a predetermined codeword and applying its output signal to a peak position decoder 16. The peak position decoder determines the position of the autocorrelation peak, and generates an output signal which can be used to indicate the presence of the predetermined codeword upon the peak being in a predetermined position. The position signal can be applied to a memory, for example, the position of the peak causing an output data codeword which was stored in a memory at a location addressed by the position of the autocorrelation peak.

Figure 3:
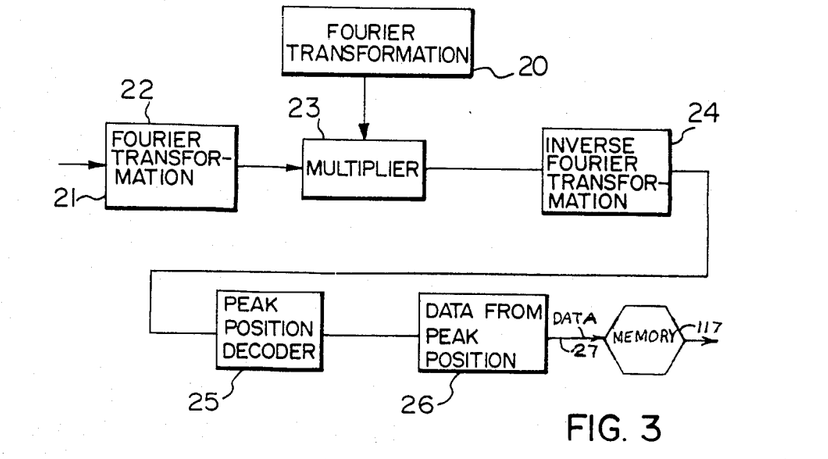
FIG. 3 is a block diagram of another embodiment of the invention.

The correlation signal can also be obtained in another manner, as will be described with reference to FIG 3. Assuming that a particular code word is to be detected, the Fourier transformation of the time reversal of this selected code word is stored in a first memory 20, which provides a reference code word. The received input signal code word is applied via signal path 21 to Fourier transformation apparatus 22. The output of memory 20 and transformation apparatus 22, which represent the time reversal of the Fourier transform of the selected code word and the Fourier transform of the received code word respectively, are applied to the inputs of a multiplier 23, where the signals are multiplied. The output signal of multiplier 23 is applied to an inverse Fourier transformation apparatus 24, which yields the cyclic cross correlation of the received code word and the selected code word of which the Fourier transform of the time reversal thereof was stored in memory 20.

The cyclic cross correlation signal is applied to a peak position decoder 25 as described earlier, and a signal representing the position of the peak is applied to a memory 26 to select the data corresponding to the peak position stored therein, and to apply it to an output data signal path 27.

In this embodiment, therefore, the correlation signal is provided by apparatus for generating a first signal representing the Fourier transform of the time reversed code word to be detected, for generating a second signal representing a Fourier transform of the input signal, for multiplying the first and second signals, for generating the correlation signal by providing the result of the inverse Fourier transform of the output of the multiplier, the result thereof thus being provided to the peak position determining apparatus. For real signals, real transforms are used and the result of the inverse Fourier transform will be real. For complex signals, complex transforms are used and the magnitude or magnitude squared of the result of the inverse Fourier transform is applied to the input of the peak position detector.

The input signal to the Fourier transformation apparatus can be sampled values of a received signal corresponding to one code word, for instance the output of an analog-to-digital converter which samples signal at a rate equal to or greater than the Nyquist rate. M complex samples are applied to the Fourier transformation apparatus 22, the output being in complex mathematical form, as is the signal at the output of memory 20. Memory 20 can be for example a matched filter consisting of m complex samples for storing the Fourier transform of the time reversed code word.

Multiplier 23 performs a complex multiplication, and provides at its output m complex values. The inverse Fourier transformation apparatus 24 transforms the frequency domain signal to a time domain signal. The magnitude of this signal should be applied to peak position decoder 25. The memory 26 can be a PROM, EPROM, ROM or other memory device which can translate the peak position as the address from which data stored in memory 26 can be output. For example, if the peak position occurs in position 86 and memory location 86 contains the data bits 110010, the output on signal path 27 is 110010.

The apparatus described above can be used to provide synchronization information relating to the input signal, i.e. frame synchronization and/or bit synchronization.

A sequence should be transmitted having a sufficient cyclic autocorrection function as described earlier, immediately followed by the same sequence such that the second sequence follows the first with no gap. Information bearing code word or code words immediately follow the sequences.

Figure 4:
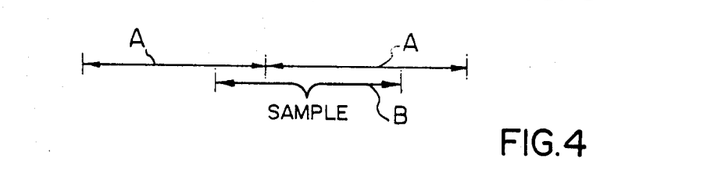
FIG. 4 is a time diagram used to represent sampling of an input signal.

As a first example, assume that the approximate time of arrival of the two sequences is known to accuracies such that a sample of the received signal equal in duration to that of one sequence can fit within the period of the two sequences. In this case, a sample equal in duration to one sequence is taken during the interval of the two concatenated sequences. For example, in FIG. 4, two concatenated m-sequences labelled A are received, and a sample having time interval B which is identical to one of time interval A is taken sometime during the double A interval.

Figure 6:
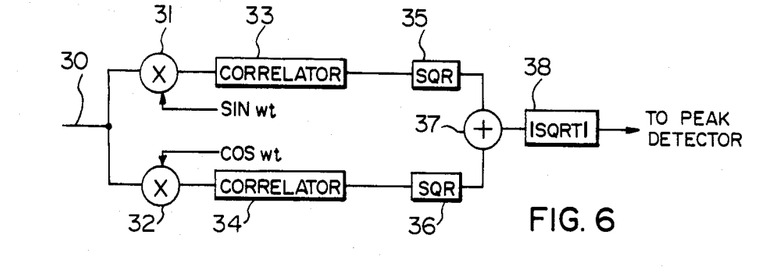

The sample during interval B is then processed in an apparatus as shown in FIG. 6, to yield the position of the autocorrelation peak, which determines the times until the arrival of the data code words (this yields frame synchronization). Since the bit rate is known, this also provides bit synchronization.

Figure 5:
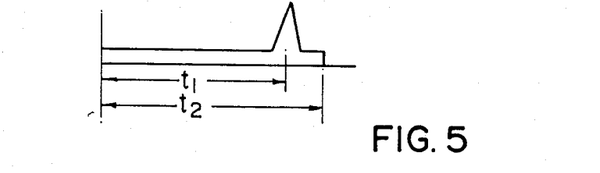
FIG. 5 is a time diagram showing the position of a correlation peak.

FIG. 5 shows the autocorrelation peak, which appears at time $t_1$, which represents the time to frame synchronization, i.e., the time until the arrival of the data code word from the autocorrelation peak. The time $t_2$ shows the duration of one code word of the received sequence.

FIG. 6 is a block diagram of a circuit for determining the autocorrelation peak as described above with reference to FIG. 5, which is used to output a cyclic autocorrelation function signal, in phase with the input signal.

An input signal is received on signal path 30. The input signal is as described above, for example an m-sequence of two concatenated m-sequences followed by a data code word or code words, in which the sample is taken starting at or after the beginning of first m-sequence and ending at or before the end of the second sequence. This signal is applied to two multipliers 31 and 32, to which sine wave and quadrature (cos wave) signals are applied respectively. The frequency of the sine and cos wave signals are the same as the carrier of the input signal.

The outputs of multipliers 31 and 32 are applied to correlators 32 and 34 respectively, the correlators being preferably of the form described above with reference to FIG. 2.

The output signals of correlators 33 and 34 are applied to squaring circuits 35 and 36 respectively, the output signals of which are applied to two inputs of adder 37. The output signal of adder 37 is applied to a circuit 38 which determines absolute value of the square root of its input signal. The output signal of square root circuit 38 provides a signal representing the magnitude of the cyclic autocorrection of the input signal, as shown in FIG. 5, which is used to provide frame synchronization and bit synchronization. The phase p is determined from the arctangent of the correlators 33 and 34 (by means disclosed herein) and can thus be used to adjust the phase of the sine wave applied to a multiplier and thus provide demodulation of the input signal.

In FIG. 6A a circuit is shown for demodulation of the input signal. The input signal is applied on signal path 40 to a multiplier 41, to which is also applied a sine wave signal having the phase of the sine wave applied to multiplier 31, to which the phase shift p is added. Thus the sine signal is in phase with the input signal.

The output signal of multiplier 41 is applied to correlator 42, which yields a signal corresponding to the cyclic autocorrelation of the input signal on signal path 43. Demodulation has thus occurred, and this cyclic autocorrelation signal can now be applied to a decoder such as memory 26 shown in FIG. 3.

In the case in which it is not known when the concatenated m sequences preceding the data codes is to start, processing as described above can start before the arrival of the first m-sequence and carried out repeatedly. In this case, an autocorrelation peak will be seen to develop. Its presence can be detected by a combination of threshold detection and differentiation, and its position can be tracked by peak position detection once its magnitude has stabilized.

Autocorrelation peak detection as described above can be used to facilitate detection of signals from several transmitters at the same receiver at the same time, to provide "code division multiple access".

Figure 7:
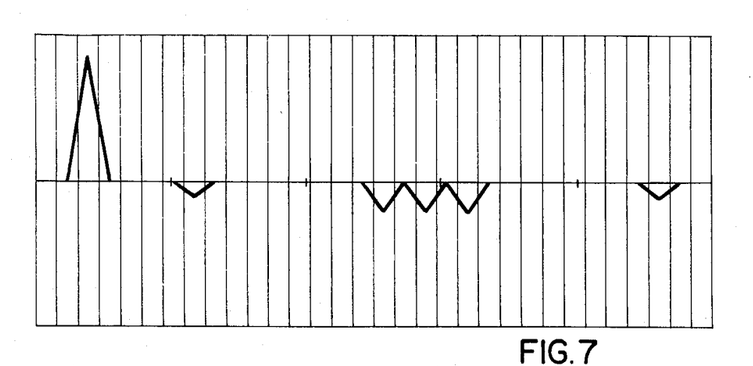
FIGS. 7 and 8 are time diagrams showing autocorrelation peaks for a multiple access embodiment of the invention.

For certain code sequences, such as deBruijn sequences, the cyclic autocorrelation function is equal to zero for some shift positions. For example, the cyclic autocorrelation of a 32 bit deBruijn sequence is shown in FIG. 7.

According to the present embodiment a receiver containing a decoder as described herein can receive signals from at least two different transmitters, provided that the frame synchronization for the transmitters is the same as far as the receiving station is concerned, and provided that the code words received from each transmitter are cyclical shifts from each other such that the autocorrection peaks of each appear where the autocorrelation function of the other is zero. In this case no mutual interference of autocorrelation peaks occur, no matter what the received power level of the received signal is.

Figure 8:
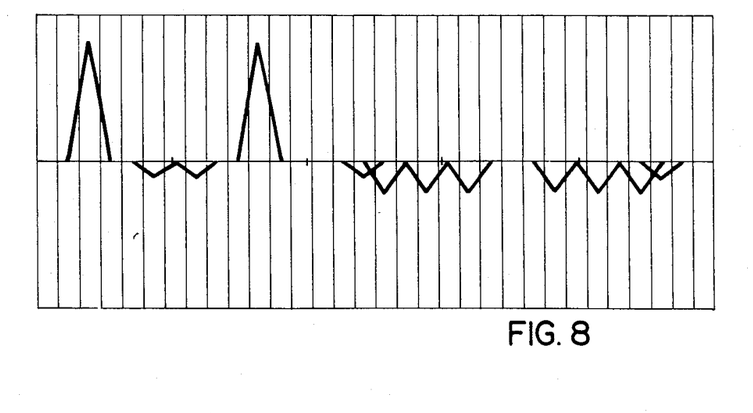

FIG. 8 shows the superposition of the cyclic autocorrelation of two different cyclic shifts of the same deBruijn sequence demonstrating non-interference of autocorrelation peaks.

As an example, a 32 bit deBruijn sequence could support 11 independent (i.e. orthogonal) signals, thereby circumventing the well known near-far problem associated with code division multiple access. To transmit useful data to each of the 11 transmitters (each one with its own cyclic shift of deBruijn sequence), a simple on-off signalling scheme is employed, for example, in which the receiving site associates the position of an autocorrelation peak with each transmitter and looks for the presence or absence of a peak in each of the 11 possible positions.

Alternatively, each transmitter can be assigned two cyclic shifts of the deBruijn sequence and use one shift for a data "1" and the other for a data "0". While this technique only allows five transmitters to use the same 32 bit deBruijn sequence, the error rate associated with the received data from each transmitter is improved since the receiver can test the magnitude of the signal in each of the two positions associated with each station and decide on the identity of the data on the basis of this comparison.

It should be noted that each signal must be received with the same frame sync, i.e. the code word from each transmitter must arrive at the receiver at the same time. This can be achieved through network timing which causes each transmitter to transmit at a time which assures its signal will be received at the proper time. This of course requires determination of path propagation delays and also requires a series of transmitted signals between the receiving station and various transmitters to adjust its time of transmission, but this functin is well known and is not part of this patent application.

It should be noted that this multiple access technique, in addition to eliminating the near-far problem, reduces the numbers of matched filters required at the receiving site from 2n (where n is the number of transmitters) to only 1. Of course each transmitter can receive signals from all of the other transmitters in the same way.

It should also be noted that it is contemplated that the above structures can be implemented in microprocessor controlled systems.

Further, the present invention appears to work with any correlatable cyclic codes, that is codes having good correlation properties, i.e., codes which have identical sidelobes, with zeros at sufficient locations to allow correlation. Examples of such codes are in sequence codes and deBruijn sequences.

An understanding of this invention will enable the reader to select other classes of codes to which it is applicable, and to conceive of alternative or other embodiments or modifications to the invention. All are believed to be within the sphere and scope of this invention, as defined in the claims appended hereto.

TABLE 3

Computer Printout of Matched Filter Showing Change of Position of Auto-Correlation Peak
APPENDIX A

| | | | | | | | | | | | | | | | | |
|---|---|---|---|---|---|---|---|---|---|---|---|---|---|---|---|---|
| CORRELATOR | 0 | 0 | 0 | 1 | 1 | 1 | 1 | 0 | 1 | 0 | 1 | 1 | 0 | 0 | 1 |
| PREVIOUS CODEWORD | 0 | 0 | 0 | 1 | 1 | 1 | 1 | 0 | 1 | 0 | 1 | 1 | 0 | 0 | 1 |
| NEW CODEWORD | 0 | 0 | 0 | 1 | 1 | 1 | 1 | 0 | 1 | 0 | 1 | 1 | 0 | 0 | 1 |

TABLE 3-continued

Computer Printout of Matched Filter Showing Change of Position of Auto-Correlation Peak

APPENDIX A

| | | | | | | | | | | | | | |
|---|---|---|---|---|---|---|---|---|---|---|---|---|---|
| CORRELATION | -1 | -1 | -1 | -1 | -1 | -1 | -1 | -1 | -1 | -1 | -1 | -1 | 5 |
| CORRELATOR | 0 | 0 | 0 | 1 | 1 | 1 | 1 | 0 | 1 | 0 | | 0 | |
| PREVIOUS CODEWORD | 0 | 0 | 0 | 1 | 1 | 1 | 1 | 0 | 1 | 0 | | 0 | |
| NEW CODEWORD | 0 | 1 | 1 | 0 | 0 | 1 | 0 | 0 | 0 | | | 1 | |
| CORRELATION | -1 | -1 | -1 | -1 | -1 | -1 | -1 | -1 | 15 | -1 | | -1 | |
| CORRELATOR | 0 | 0 | 0 | 1 | 1 | 1 | 1 | 0 | 1 | 0 | | 0 | |
| PREVIOUS CODEWORD | 0 | 1 | 1 | 0 | 0 | 1 | 0 | 0 | 0 | 1 | | | |
| NEW CODEWORD | 1 | 0 | 0 | 1 | 0 | 0 | 0 | 1 | 1 | | | | |
| CORRELATION | -1 | -1 | -1 | -1 | -1 | -1 | -1 | -1 | -1 | 15 | -1 | -1 | |
| CORRELATOR | 0 | 0 | 0 | 1 | 1 | 1 | 1 | 0 | 1 | 0 | | 0 | |
| PREVIOUS CODEWORD | 1 | 0 | 0 | 1 | 0 | 0 | 0 | 1 | 1 | 1 | | | |
| NEW CODEWORD | 0 | 1 | 1 | 1 | 1 | 0 | 1 | 0 | 1 | | | 1 | |
| CORRELATION | -1 | 15 | -1 | -1 | -1 | -1 | -1 | -1 | -1 | -1 | | -1 | |
| CORRELATOR | 0 | 0 | 0 | 1 | 1 | 1 | 1 | 0 | 1 | 0 | | | |
| PREVIOUS CODEWORD | 0 | 1 | 1 | 1 | 1 | 0 | 1 | 0 | 1 | 1 | | | |
| NEW CODEWORD | 0 | 0 | 1 | 1 | 1 | 1 | 0 | 1 | 0 | | | | 0 |
| CORRELATION | 15 | -1 | -1 | -1 | -1 | -1 | -1 | -1 | -1 | | | | -1 |
| CORRELATOR | 0 | 0 | 0 | 1 | 1 | 1 | 1 | 0 | 1 | 0 | | 0 | |
| PREVIOUS CODEWORD | 0 | 0 | 1 | 1 | 1 | 1 | 0 | 1 | 0 | 1 | | | 0 |
| NEW CODEWORD | 0 | 0 | 0 | 1 | 1 | 1 | 1 | 0 | 1 | 0 | | | 0 |
| CORRELATION | -1 | -1 | -1 | -1 | -1 | -1 | -1 | -1 | -1 | | | | |
| CORRELATOR | 0 | 0 | 0 | 1 | 1 | 1 | 1 | 0 | 1 | 0 | | | |
| PREVIOUS CODEWORD | 0 | 0 | 0 | 1 | 1 | 1 | 1 | 0 | 1 | 0 | | | |
| NEW CODEWORD | 1 | 1 | 1 | 1 | 0 | 1 | 0 | -1 | 1 | 0 | | | |
| CORRELATION | -1 | -1 | 15 | -1 | -1 | -1 | -1 | -1 | -1 | -1 | | | |
| CORRELATOR | 0 | 0 | 0 | 1 | 1 | 1 | 1 | 0 | 1 | 0 | | 0 | |
| PREVIOUS CODEWORD | 1 | 1 | 1 | 1 | 0 | 1 | 0 | 1 | 1 | 0 | 0 | 0 | |
| NEW CODEWORD | 1 | 0 | 1 | 0 | 1 | 1 | 0 | 0 | 1 | 0 | | | |
| CORRELATION | -1 | -1 | -1 | -1 | -1 | 15 | -1 | -1 | -1 | -1 | | | |
| CORRELATOR | 0 | 0 | 0 | 1 | 1 | 1 | 1 | 0 | 1 | 0 | | | |
| PREVIOUS CODEWORD | 1 | 0 | 1 | 0 | 1 | 1 | 0 | 0 | 1 | | | | |
| NEW CODEWORD | 0 | 1 | 0 | 1 | 1 | 0 | 0 | 1 | 0 | 0 | | | |
| CORRELATION | -1 | -1 | -1 | -1 | -1 | -1 | 15 | -1 | -1 | | | | |
| CORRELATOR | 0 | 0 | 0 | 1 | 1 | 1 | 1 | 0 | 1 | 0 | | 0 | |
| PREVIOUS CODEWORD | 0 | 1 | 0 | 1 | 1 | 0 | 0 | 1 | 0 | 0 | | | |
| NEW CODEWORD | 1 | 0 | 1 | 1 | 0 | 0 | 1 | 0 | 0 | 0 | | | |
| CORRELATION | -1 | -1 | -1 | -1 | -1 | -1 | -1 | 15 | -1 | -1 | | | |
| CORRELATOR | 0 | 0 | 0 | 1 | 1 | 1 | 1 | 0 | 1 | 0 | | 0 | |
| PREVIOUS CODEWORD | 1 | 0 | 1 | 1 | 0 | 0 | 1 | 0 | 0 | 0 | | | 1 |
| NEW CODEWORD | 0 | 1 | 0 | 0 | 0 | 1 | 1 | 1 | 1 | 0 | | 0 | |
| CORRELATION | -1 | -1 | -1 | -1 | -1 | -1 | -1 | -1 | -1 | | | 15 | |
| CORRELATOR | 0 | 0 | 0 | 1 | 1 | 1 | 1 | 0 | 1 | 0 | | 0 | |
| PREVIOUS CODEWORD | 0 | 1 | 1 | 0 | 0 | 1 | 1 | 1 | 1 | 0 | | 0 | 1 |
| NEW CODEWORD | 0 | 0 | 1 | 0 | 0 | 0 | 1 | 1 | 1 | 1 | | 1 | 0 |
| CORRELATION | -1 | -1 | -1 | -1 | -1 | -1 | -1 | -1 | -1 | | | 15 | -1 |
| CORRELATOR | 0 | 0 | 0 | 1 | 1 | 1 | 1 | 0 | 1 | 0 | | 0 | |
| PREVIOUS CODEWORD | 0 | 0 | 1 | 0 | 0 | 0 | 1 | 1 | 1 | 0 | | | 0 |
| NEW CODEWORD | 1 | 0 | 0 | 0 | 1 | 1 | 1 | 1 | 0 | | | 1 | |
| CORRELATION | -1 | -1 | -1 | -1 | -1 | -1 | -1 | -1 | -1 | | | -1 | 5 |
| CORRELATOR | 0 | 0 | 0 | 1 | 1 | 1 | 1 | 0 | 1 | 0 | | 0 | |
| PREVIOUS CODEWORD | 1 | 0 | 0 | 0 | 1 | 1 | 1 | 1 | 0 | 0 | | | |
| NEW CODEWORD | 1 | 1 | 1 | 0 | 1 | 0 | 1 | 1 | 0 | 0 | | 0 | |
| CORRELATION | -1 | -1 | -1 | 15 | -1 | -1 | -1 | -1 | -1 | -1 | | -1 | |
| CORRELATOR | 0 | 0 | 0 | 1 | 1 | 1 | 1 | 0 | 1 | 0 | | 0 | |
| PREVIOUS CODEWORD | 1 | 1 | 1 | 0 | 1 | 0 | 1 | 1 | 0 | 0 | | 0 | |
| NEW CODEWORD | 1 | 1 | 0 | 1 | 0 | 1 | 1 | 0 | 0 | 1 | | 0 | 0 |
| CORRELATION DONE | -1 | -1 | -1 | -1 | 15 | -1 | -1 | -1 | -1 | | | -1 | -1 |

I claim:

1. A coded signal decoder comprising:
   (a) first means for concatenating a cyclic block coded input signal, having a period of a predetermined codeword, with itself,
   (b) a first filter matched to a first predetermined code sequence of said signal connected to receive the concatenated signal,
   (c) a first peak position decoder connected to receive an output signal from the matched filter for providing an indication of the position of an autocorrelation peak corresponding to said code sequence relative to the input signal code, whereby the particular code is designated.

2. A decoder as defined in claim 1, in which the means for concatenating is comprised of a delay line, means for applying the input signal to the filter and the delay line simultaneously, whereby a coded input signal sequence having the same number of code elements as said code sequence is stored in the delay line, and means for applying only the signal retained in the delay line to the filter following application of said coded input signal sequence thereto.

3. A decoder as defined in claim 2, in which the delay line is a shift register having n bit positions corresponding to the number of bits in a codeword constituting said coded sequence.

4. A decoder as defined in claim 2 in which the delay line is an analog delay line and the matched filter is an analog matched filter.

5. A decoder as defined in claim 4 in which the delay line is a SAW device.

6. A decoder as defined in claim 4 in which the delay line is a charge coupled device.

7. A coded signal decoder as defined in claim 2, 3, or 4 in which an n bit code sequence is passed into the delay line at a rate of R hertz, means for passing the code sequence from the delay line into the matched filter at a rate of at least 2nR hertz, and for passing the output of the matched filter into the peak position decoder at the same rate of 2nR hertz.

8. A coded signal decoder as defined in claim 2 or 3 in which an n bit code sequence is clocked into the delay line at a rate of R hertz, means for clocking the code sequence from the delay line into the matched filter at a rate of at least 2nR hertz, and for clocking the output of the matched filter into the peak position decoder at the same rate of at least 2nR hertz.

9. A decoder as defined in claim 1, including
(a) second means for concatenating said cyclic block coded input signal with itself,
(b) a second filter matched to a second predetermined code sequence of said signal connected to receive the latter concatenated signal,
(c) a second peak position decoder connected to receive an output signal from the second matched filter for providing an indication of the position of an autocorrelation peak corresponding to said second code sequence relative to the input signal code,
(d) means for switching alternate sequences of code elements having the same number of code elements as said code sequence carried by said input signal sequentially to said first and second concatenating means, and
(e) means for alternately switching the output signals of the first and second peak position decoders sequentially to an output terminal.

10. A decoder as defined in claim 9, in which the second means for concatenating is comprised of a second delay line, means for applying the input signal to the second filter and the second delay line simultaneously, whereby a coded input signal sequence having the same number of code elements as said code sequence is stored in the second delay line, and means for applying only the signal retained in the second delay line to the second filter following application of said coded input signal sequence thereto.

11. A decoder as defined in claim 10, in which the second delay line is a shift register having n bit positions corresponding to the number of bits in a codeword constituting said coded sequence.

12. A decoder as defined in claim 10 in which the second delay line is an analog delay line and the second matched filter is an analog matched filter.

13. A decoder as defined in claim 12 in which the second delay line is a SAW device.

14. A decoder as defined in claim 12 in which the second delay line is a charge coupled device.

15. A decoder as defined in claim 1, 2 or 9, in which the block coded input signal is comprised of a codeword of n bits made from suitably encoding k information bits, where the the number of codewords $\leq 2^k$.

16. A method of decoding a cyclic block code containing a predetermined codeword comprising:

(a) concatenating a signal containing the codeword with itself,
(b) applying the concatenated signal to a matched filter, to provide a peaking signal when a section of the concatenated signal one codeword duration matches the filter,
(c) sensing the position of the peaking signal relative to a predetermined instant in time whereby the identity of the codeword and thus data can be determined.

17. A method of decoding a cyclic block code as defined in claim 16 comprising clocking the code sequence into the delay line at a rate of R hertz, and clocking the code sequence from the delay line into the matched filter at a rate of at least 2nR hertz, and for clocking the output of the matched filter into the peak position decoder at the same rate of at least 2nR hertz.

18. A decoder comprising:
(a) means for providing a correlation signal representing a cyclic correlation of an input signal with a signal representing a predetermined codeword,
(b) means for determining the position of an autocorrelation peak resulting from said correlation signal, and
(c) means responsive to the position determining means for indicating the presence of said predetermined codeword upon said peak being in a predetermined position.

19. A decoder as defined in claim 18 in which the providing means is comprised of a matched filter, matched to said predetermined codeword, means for cyclically shifting n times an input signal code sequence having length n bits containing said code, n being a positive integer, and means for applying the shifted input signal to said filter, whereby said signal representing the cyclic correlation of the input signal is provided at the output of the filter.

20. A decoder as defined in claim 18 in which the input signal is a cyclic coded signal and the providing means is comprised of means for concatenating the cyclic coded input signal, having a period of a predetermined codeword, means for applying said concatenated signal to a first matched filter matched to a predetermined code sequence, whereby said signal representing the cyclic correlation of the input signal is provided at the output of the filter.

21. A decoder as defined in claim 18, 19 or 20 in which the indicating means is comprised of a memory containing at least one data code, and including means for addressing the location of the data code in said memory upon the autocorrelation peak being in said predetermined position.

22. A decoder as defined in claim 18, in which the providing means is comprised of means for generating a first signal representing either a real or complex Fourier transform of a time reversal of said codeword, means for generating a second signal representing a real or complex Fourier transform of the input signal, means for multiplying the first and second signals, means for generating said correlation signal by providing a required component of the inverse Fourier transform of the output of the multiplying means, for application to said peak position determining means.

23. A decoder as defined in claim 22, in which the indicating means is comprised of a memory containing at least one data code, and including means for addressing the location of the data code in said memory upon the autocorrelation peak being in said predetermined position.

24. A decoder for determining the synchronization of an input signal comprised of a correlatable cyclically shifted codeword once concatenated with itself followed by at least one information bearing codeword comprising:
(a) means for providing a sample of the received input signal starting at or after the beginning of the concatenated code word sequence and ending before or at the end of the concatenated codeword sequence, the sample having the length of the codeword,
(b) first correlating means for correlating the sample with a sample of the codeword to provide a correlation signal,
(c) first means for determining the position of the autocorrelation peak, whereby the position of said peak relative to the end of the concatenated sequence indicates the time prior to the start of the information bearing codeword.

25. A decoder for determining the synchronization of an input signal comprised of an m sequence code once concatenated with itself followed by at least one information bearing codeword comprising:
(a) means for providing an m length sample of the received input signal starting at or after the beginning of the m sequence and ending before or at the end of the concatenated code,
(b) first and second multipliers for multiplying the sample with first sine and cosine waveform signals respectively, the latter signals having the frequency of a carrier of the input signal,
(c) first and second correlating means for providing correlation signals representing the cyclic correlation of output signals of the first and second multipliers respectively with a signal representing a predetermined codeword,
(d) means for providing a signal representing the arctangent of the output signals of the first and second correlating means,
whereby said latter signal representing the magnitude of the cyclic autocorrelation function is obtained at a peak position corresponding to the phase of the m sequence sample signal relative to the information bearing codeword.

26. A decoder as defined in claim 25, further including a third multiplier, means for applying the input signal to the multiplier, means for applying a sine waveform signal having the frequency of the first sine waveform signal and phase modified by said phase of the m sequence sample signal to the multiplier, means for applying the output signal of the third multiplier to a correlator for correlating the latter output signal with said codeword resulting in demodulation thereof.

27. A decoder as defined in claim 25 or 26 including peak position determining means comprised of first and second squaring means for providing signals representative of the square of the outputs of the correlators respectively, means for adding the outputs of the squaring means to provide a sum signal, and means for providing an output signal corresponding to the square root of the sum signal.

28. A decoder as defined in claim 25 or 26, in which each correlating means is comprised of a matched filter, matched to said m sequence code, means for cyclically shifting m times said input signal, and means for applying the shifted signal to the filter, whereby a signal representing the cyclic correlation of the m sequence code is provided at the output of the filter.

29. A decoder as defined in claim 25 or 26, in which each correlating means is comprised of a matched filter, matched to said m sequence code, means for cyclically shifting m times said input signal, and means for applying the shifted signal to the filter, whereby a signal representing the cyclic correlation of the m sequence code is provided at the output of the filter, and including peak position signal determining means comprised of first and second squaring means for providing signals representative of the square of the outputs of the correlators respectively, means for adding the outputs of the squaring means to provide a sum signal, and means for providing the peak position signal corresponding to the square root of the sum signal.

30. A decoder for determining the synchronization of an input signal comprised of a correlatable cyclically shifted codeword once concatenated with itself followed by at least one information bearing codeword comprising:
(a) means for repeatedly providing a sample of the received input signal starting before the arrival of the concatenated codeword sequence and ending before or at the end of the concatenated codeword sequence, the sample having the length of the codeword,
(b) first correlating means for repeatedly correlating the sample with a sample of the codeword to provide a correlation signal,
(c) first means for determining the position of the autocorrelation peak,
whereby the position of said peak relative to the end of the concatenated sequence indicates the time prior to the start of the information bearing codeword.

31. A decoder for determining the synchronization of an input signal comprised of an m sequence code once concatenated with itself followed by at least one information bearing codeword comprising:
(a) means for repeatedly providing an m length sample of the received input signal starting before the arrival of the first m sequence codeword and ending before or at the end of the concatenated codeword,
(b) first and second multipliers for multiplying the same with first sine and cosine waveform signals respectively, the latter signals having the frequency of a carrier of the input signal,
(c) first and second correlating means for providing correlation signals representing the cyclic correlation of the output signals of the first and second multipliers respectively with a signal representing a predetermined codeword,
(d) means for providing a signal representing the square of the output signals of the first and second correlating means,
whereby said latter signal representing the magnitude of the cyclic autocorrelation function is obtained at a peak position corresponding to the phase of the m sequence sample signal relative to the information bearing codeword.

32. A decoder as defined in claim 24, in which the input signal is comprised of at least two received signals, each having autocorrelation peak having the same time prior to the start of the information bearing codeword, the codewords being cyclic shifts of each other such that the autocorrelation peaks of each appear where the autocorrelation function of the other is zero.

33. A decoder as defined in claim 24, 30 or 32, in which each input signal is a deBruijn sequence.

34. A decoder as defined in claim 32, in which received signals are received in groups of two, each group of two being received from a single transmitter, each signal of a group being a cyclic shift of the deBruijn sequence, one representing a data "1" and one representing a data "0".

35. A decoder as defined in claim 1, including
 (a) second means for concatenating a cyclic block coded input signal with itself,
 (b) a second filter matched to said predetermined code sequence of said signal, connected to receive the concatenated signal,
 (c) means for switching alternate sequences of code elements having the same number of code elements as said code sequence carried by the input signal sequentially to the first and second concatentating means, and
 (d) means for alternately switching the output signals of the first and second filters to said peak position decoder, from which an output signal is desired.

36. A decoder as defined in claim 24, 30 or 32, in which the codewords are m sequence codes.

* * * * *